(12) United States Patent
Mengel et al.

(10) Patent No.: US 8,884,434 B2
(45) Date of Patent: Nov. 11, 2014

(54) METHOD AND SYSTEM FOR IMPROVING RELIABILITY OF A SEMICONDUCTOR DEVICE

(75) Inventors: Manfred Mengel, Bad Abbach (DE); Joachim Mahler, Regensburg (DE); Khalil Hosseini, Weihmichl (DE)

(73) Assignee: Infineon Technologies AG, Neubiberg (DE)

( * ) Notice: Subject to any disclaimer, the term of this patent is extended or adjusted under 35 U.S.C. 154(b) by 486 days.

(21) Appl. No.: 12/890,721

(22) Filed: Sep. 27, 2010

(65) Prior Publication Data

US 2012/0074553 A1    Mar. 29, 2012

(51) Int. Cl.
*H01L 23/48* (2006.01)
*H01L 23/00* (2006.01)
*H01L 25/065* (2006.01)

(52) U.S. Cl.
CPC .............. *H01L 24/33* (2013.01); *H01L 24/34* (2013.01); *H01L 2924/0103* (2013.01); *H01L 2924/01005* (2013.01); *H01L 2924/01046* (2013.01); *H01L 2224/04026* (2013.01); *H01L 2924/00013* (2013.01); *H01L 2224/29111* (2013.01); *H01L 24/83* (2013.01); *H01L 2924/01029* (2013.01); *H01L 2924/0665* (2013.01); *H01L 2224/32245* (2013.01); *H01L 2924/13055* (2013.01); *H01L 2924/0105* (2013.01); *H01L 24/10* (2013.01); *H01L 24/29* (2013.01); *H01L 24/32* (2013.01); *H01L 2924/3656* (2013.01); *H01L 2924/01033* (2013.01); *H01L 24/03* (2013.01); *H01L 2924/01327* (2013.01); *H01L 2924/0132* (2013.01); *H01L 2224/32145* (2013.01); *H01L 2924/01079* (2013.01); *H01L 2224/33181* (2013.01); *H01L 2224/29* (2013.01); *H01L 25/0657* (2013.01); *H01L 2224/0401* (2013.01); *H01L 2924/014* (2013.01); *H01L 24/05* (2013.01); *H01L 2224/29298* (2013.01); *H01L 2224/73265* (2013.01); *H01L 2224/48091* (2013.01); *H01L 2224/13099* (2013.01); *H01L 2224/48247* (2013.01); *H01L 2224/2919* (2013.01); *H01L 2224/05647* (2013.01); *H01L 2225/06568* (2013.01); *H01L 2224/83801* (2013.01); *H01L 2224/29101* (2013.01); *H01L 2224/05618* (2013.01); *H01L 2924/01082* (2013.01); *H01L 2924/01013* (2013.01)
USPC ........................................... 257/762; 438/652

(58) Field of Classification Search
USPC .......... 257/741, 750, 762, E23.023; 438/612, 438/652
See application file for complete search history.

(56) References Cited

U.S. PATENT DOCUMENTS

| 6,936,925 | B1 * | 8/2005 | Lopatin et al. | 257/762 |
| 7,432,584 | B2 | 10/2008 | Goh et al. | |
| 7,932,165 | B1 * | 4/2011 | Lin et al. | 438/464 |
| 2002/0153596 | A1 * | 10/2002 | Tsubosaki et al. | 257/666 |

(Continued)

FOREIGN PATENT DOCUMENTS

JP    62104059 A    5/1987

OTHER PUBLICATIONS

C. Y. Oh et al., "A new solder wettting layer for Pb-free solders", J. Material Research, vol. 24, No. 2 (Feb. 2009): pp. 297-300.*

(Continued)

*Primary Examiner* — Michele Fan (57) ABSTRACT

A method and a system for improving reliability of a semiconductor device are provided. In one embodiment, a semiconductor device is provided comprising a semiconductor chip, a metallization layer comprising a metallic material disposed over a surface of the semiconductor chip, and an alloy layer comprising the metallic material disposed over the metallization layer.

15 Claims, 7 Drawing Sheets

(56) References Cited

U.S. PATENT DOCUMENTS

| | | |
|---|---|---|
| 2005/0017355 A1* | 1/2005 | Chou et al. .................... 257/738 |
| 2005/0026413 A1* | 2/2005 | Lee et al. ...................... 438/612 |
| 2005/0046038 A1* | 3/2005 | Farnworth et al. ............ 257/777 |
| 2005/0285269 A1* | 12/2005 | Cao et al. ...................... 257/758 |
| 2006/0220259 A1* | 10/2006 | Chen et al. .................... 257/778 |
| 2007/0231963 A1* | 10/2007 | Doan et al. .................... 438/107 |
| 2008/0083986 A1* | 4/2008 | Curtis et al. .................. 257/738 |
| 2008/0223906 A1 | 9/2008 | Choi et al. |
| 2008/0237314 A1* | 10/2008 | Yu et al. ........................ 228/245 |
| 2010/0000772 A1* | 1/2010 | Letterman et al. ............ 174/260 |
| 2010/0071940 A1* | 3/2010 | Ejiri et al. ..................... 174/257 |
| 2010/0120184 A1* | 5/2010 | Huang et al. .................... 438/29 |

OTHER PUBLICATIONS

Young Min Kim et al.; A New Cu-Zn Solder Wetting Layer for Improved Impact Reliability; 2009 IEEE, 2009 electronic Components and Technology Conference; pp. 1008-1013.

English language abstract of JP 62104059 A dated May 14, 1987.

Chang Yul Oh et al. A new solder wetting layer for Pb-free solders J. Mater. Res., vol. 24, No. 2, Feb. 2009 pp. 297-300.

* cited by examiner

METHOD AND SYSTEM FOR IMPROVING RELIABILITY OF A SEMICONDUCTOR DEVICE

TECHNICAL FIELD

The present invention relates generally to a semiconductor device. In particular, the present disclosure relates to a method and system for improving reliability of a semiconductor device.

BACKGROUND

In many semiconductor devices, a metallic coating is applied over the front or back surface of a semiconductor chip to provide better electrical and thermal conductivity. One common metal used as a final metallization layer is copper. Typically, the layer is disposed between a semiconductor chip and a lead frame or between semiconductor chips. However, such metallization layer has certain disadvantages, for example, disconnection at the interface between the copper metallization and tin-containing solder material based on growth of intermetallic phases accompanied by Kirkendall voids.

Tin-containing solder is used due to its good mechanical properties and wetting characteristics with the copper metallization layer. However, it reacts with the copper wetting layer and builds copper-tin intermetallic phases. Particularly tin builds with copper intermetallic phases $Cu_3Sn$ at temperature higher than 200 degrees accompanied with development of Krikendall voids causes reliability issue. After high temperature storage or temperature cycling voids strongly develop at the interface of the tin-containing solder joints and copper metallization layer. These voids (Krikendall voids) are formed due to different diffusion coefficients of copper and tin on the copper side of the interface. As a result of such voids, the metallization layer begins to separate and leads to electrical failure of the semiconductor device. Therefore, a need exists for a method and system that avoid or slow the dynamic of growth of intermetallic phases accompanied by Krikendall voids to improve the reliability of semiconductor devices for high temperature application.

SUMMARY OF INVENTION

The present disclosure provides a semiconductor device with improved reliability. In one embodiment, a semiconductor device is provided comprising a semiconductor chip, a metallization layer comprising a metallic material disposed over a surface of the semiconductor chip, and an alloy layer comprising the metallic material disposed over the metallization layer.

In another embodiment, the semiconductor device comprises at least one semiconductor chip, a metallization layer comprising a metallic material disposed over at least one surface of the at least one semiconductor chip, an alloy layer comprising the metallic material disposed over the metallization layer, and a soldering material disposed between the at least one semiconductor chip.

In yet another embodiment, a method for improving reliability of a semiconductor device is provided. The method comprises providing a semiconductor chip, disposing a metallization layer comprising a metallic material over a surface of the semiconductor chip, disposing an alloy layer comprising the metallic material over the metallization layer, and attaching the semiconductor chip to a conductive element over a soldering material.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips are described below. The semiconductor chips may be of extremely different types, may be manufactured by different technologies and may include for example, integrated electrical or electro-optical circuits or passives or MEMS etc. Semiconductor chips may be configured, for example, as power transistors, power diodes, IGBTs (Isolated Gate Bipolar Transistors). Semiconductor chips may have a vertical structure and may be fabricated in such a way that electrical currents can flow in a direction perpendicular to the main surfaces of the semiconductor chips. These semiconductor chips may have contact elements disposed on its main surfaces, which includes a top surface and a bottom surface. Examples of semiconductor chips having a vertical structure include power transistors and power diodes. In case of power transistors, the source electrode and the gate electrode may be disposed on a first main surface while the drain electrode may be disposed on a second main surface. In case of a power diode, the anode electrode may be disposed on a first main surface while the cathode electrode may be disposed on a second main surface.

The integrated circuits may, for example, be designed as logic integrated circuits, analog integrated circuits, mixed signal integrated circuits, power integrated circuits, memory circuits or integrated passives. Furthermore, the semiconductor chips may be configured as MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, microphones etc. The semiconductor chips may be configured as antennas and/or discrete passives. The semiconductor chips may also include antennas and/or discrete passives. Semiconductor chips, in which such functional elements are embedded, generally contain electronic circuits which serve for driving the functional elements or further process signals generated by the functional elements. The semiconductor chips need not be manufactured from specific semiconductor material and, furthermore, may contain inorganic and/or organic materials that are not semiconductors, such as for example, discrete passives, antennas, insulators, plastics or metals. Moreover, the semiconductor chips may be packaged or unpackaged.

The semiconductor chips have contact elements which allow electrical contact to be made with the semiconductor chips. The contact elements may be composed of any desired electrically conductive material, for example, of a metal, such as aluminum, nickel, palladium, gold or copper, a metal alloy, a metal stack or an electrically conductive organic material. The contact elements may be situated on the active main surfaces of the semiconductor chips or on other surfaces of the semiconductor chips. The active or passive structures of the semiconductor chips are usually arranged below the active main surfaces and can be electrically contacted via the contact elements. In case of power transistors, the contact elements may be drain, source or date electrodes.

The devices described in the following may include external contact elements that are accessible from outside of the devices to allow electrical contact to be made from outside of the devices. In addition, the external contact elements may be thermally conductive and serve as heat sinks for heat dissipation of the semiconductor chips. The external contact elements may be composed of any electrically conductive material, for example, a metal such as copper, Pd, Ni, Au, etc.

The devices described in the following may include an encapsulating material covering at least parts of the semiconductor chips. The encapsulating material is an electrically insulating material, which is at most marginally electrically conductive relative to the electrically conductive components of the device. Examples of an encapsulating material include a mold material and an epoxy based material. The encapsulating material may be any appropriate duroplastic, thermoplastic, laminate (prepreg) or thermosetting material and may contain filler materials. Various techniques may be employed to cover the semiconductor chips with the mold material, for example, compression molding, lamination or injection molding.

Figure 1:
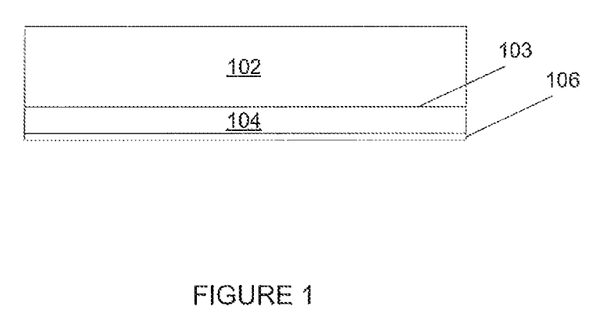
FIG. 1 is a diagram illustrating a semiconductor chip with improved reliability in accordance with one embodiment of the present disclosure.

The present disclosure provides a method and system for improving reliability of semiconductor devices. Referring to FIG. 1, a diagram illustrating a semiconductor chip with improved reliability is depicted in accordance with one embodiment of the present disclosure. In one embodiment, a semiconductor chip 102 is provided. The semiconductor chip may be composed of silicon or other types of semiconductor materials. Semiconductor chip 102 comprises a backside metallization layer 104. One example of the metallization layer 104 is a copper metallization layer with a thickness of about 2 to 20 micrometers with a thickness of preferably from about 10 to 15 micrometers. The copper metallization layer 104 serves as a thick coating to provide an increase in electrical and thermal conductivity and thus provides better performance for electrical components, such as semiconductor chip 102.

In this embodiment, the copper metallization layer 104 is disposed over the back surface 103 of the semiconductor chip 102. The thickness of the copper metallization layer 104 may be from about 10 to 15 micrometers. However, metals other than copper and other thicknesses may be used to form the metallization layer 104 without departing the spirit and scope of the present disclosure.

To provide an improved solder joint and prevent voids from developing at the interface of the copper metallization layer 104 and tin-containing solder, a layer of alloy 106 is disposed over the copper metallization layer, for example, copper metallization layer 104. In one embodiment, the alloy layer 106 has a thickness from about 1 to 5 micrometers and has an alloy content of up to 20 percent on Zinc in weight. The alloy used may be zinc-copper alloy. The alloy layer 106 may be formed by galvanically depositing the alloy over the metallization layer 104. In one embodiment, the alloy layer and the copper metallization layer together form the outermost metallization layer of the semiconductor device. For example, alloy layer 106 and copper metallization layer 104 form the outermost metallization layer at the back surface 103 of the semiconductor chip.

The alloy layer 106 reduces the formation of intermetallic phases and void development at the interface of copper metallization layer 104 and tin-containing solder joint and thus increases the reliability of the semiconductor chip 102. The reduction of voids impacts the thermal management in package so that the alloy layer 106 stops or reduces the degradation of heat dissipation during attachment of semiconductor chip 102 to other components, such as a chip carrier or a lead frame. It is noted that the alloy layer preferably comprises a metallic material of the metallization layer. In this case, the alloy layer 106 comprises copper which is part of the copper metallization layer 104.

Figure 2:
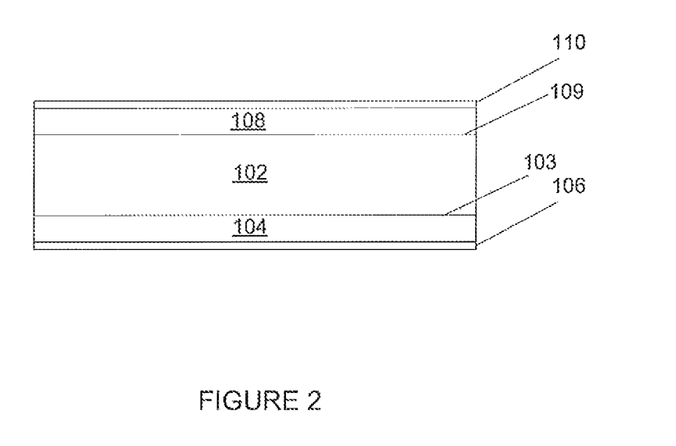
FIG. 2 is a diagram illustrating a semiconductor chip with improved reliability in accordance with an alternative embodiment of the present disclosure.

Referring to FIG. 2, a diagram illustrating a semiconductor chip with improved reliability is depicted in accordance with an alternative embodiment of the present disclosure. In the alternative embodiment, in addition to depositing over the back surface 103 of the semiconductor chip 102, a metallization layer 108 may be formed over the front surface 109 of the semiconductor chip 102.

One example of the metallization layer 108 is a copper metallization layer with a thickness of about 2 to 20 micrometers with a thickness of preferably from about 10 to 15 micrometers. The copper metallization layer 108 serves as a thick coating to provide an increase in electrical and thermal conductivity and thus provides better performance for electrical components, such as semiconductor chip 102. In this embodiment, the copper metallization layer 108 is disposed over the front surface 109 of the semiconductor chip 102. The thickness of the copper metallization layer 108 may be from about 10 to 15 micrometers. However, metals other than copper and other thicknesses may be used to form the metallization layer 108 without departing the spirit and scope of the present disclosure.

To provide an improved solder joint and prevent voids from developing at the interface of the copper metallization layer 108 and tin-containing solder, a layer of alloy 110 is disposed over the metallization layer, for example, copper metallization layer 108. In one embodiment, the alloy layer 110 has a thickness from about 1 to 5 micrometers and has a content of zinc up to 20 percent in weight. The alloy used may be zinc-copper alloy. The alloy layer 110 may be formed by galvanically depositing the alloy over the metallization layer 108. In one embodiment, the alloy layer and the copper metallization layer together form the outermost layer of the semiconductor device. For example, alloy layer 106 and copper metallization layer 104 form the outermost metallization layer at the backs surface 103 of the semiconductor chip. Alloy layer 110 and copper metallization layer 108 form the outermost metallization layer at the front surface 109 of the semiconductor chip 102.

The alloy layer 110 reduces the formation of intermetallic Phases and void development at the interface of copper metallization layer 108 and tin-containing solder joint and thus increases the reliability of the semiconductor chip 102. The reduction of voids impacts the thermal management in package so that the alloy layer 110 stops or reduces the degradation of heat dissipation during attachment of semiconductor chip 102 to other components, such as a chip carrier or a lead frame. It is noted that the alloy layer preferably comprises a metallic material of the metallization layer. In this case, the alloy layer 110 comprises copper which is part of the copper metallization layer 108 and alloy layer 106 comprises copper which is part of the copper metallization layer 104.

Figure 3:
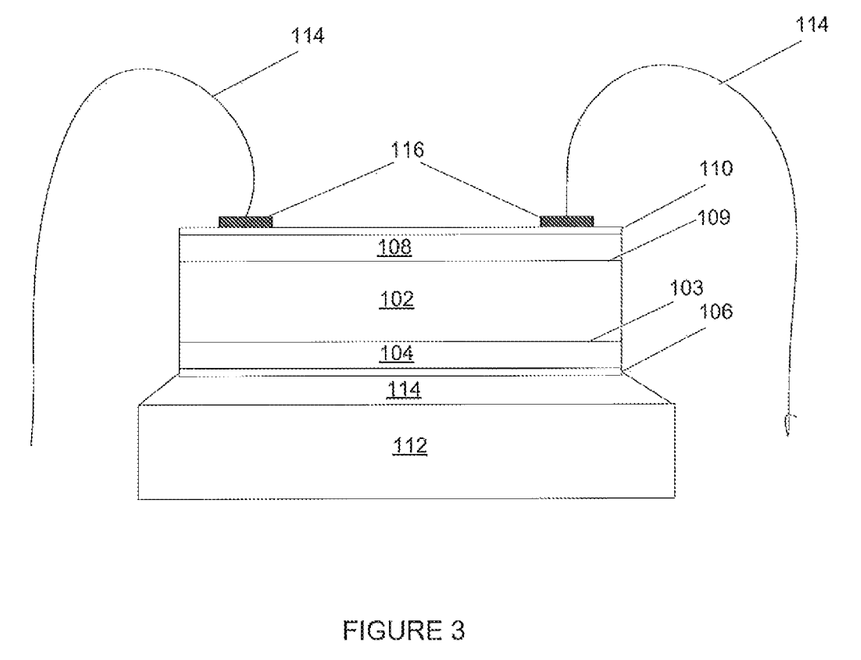
FIG. 3 is a diagram illustrating a semiconductor device with improved reliability in accordance with one embodiment of the present disclosure.

Referring to FIG. 3, a diagram illustrating a semiconductor device with improved reliability is depicted in accordance with one embodiment of the present disclosure. In this embodiment, a semiconductor chip 102 as illustrated in FIG. 2, having a front side 110 and a back side alloy layer 106, is disposed over a carrier, such as, lead frame 112. Semiconductor chip 102 is attached to lead frame 112 over a soldering material, such as tin-containing solder 114. In one embodiment, the soldering material 114 may be disposed over the carrier or lead frame 112. Then, the semiconductor chip 102 is attached to the soldering material 114 such that an interface is formed between the alloy layer 106 of chip 102 and the soldering material 114. Thus, a chip-on-lead frame configuration is provided.

Subsequently, other conductive elements 114, such as bond wires, may be coupled to the semiconductor chip 102 via contact pads 116 disposed on alloy layer 110. By providing an alloy layer, such as alloy layer 106, over the metallization layer, such as metallization layer 104, formation of voids between the copper metallization layer 104 and tin-containing solder joint 114 is reduced. This results in better heat dissipation from the semiconductor chip 102 to the lead frame 112 which leads to improved reliability of the overall device.

Figure 4:
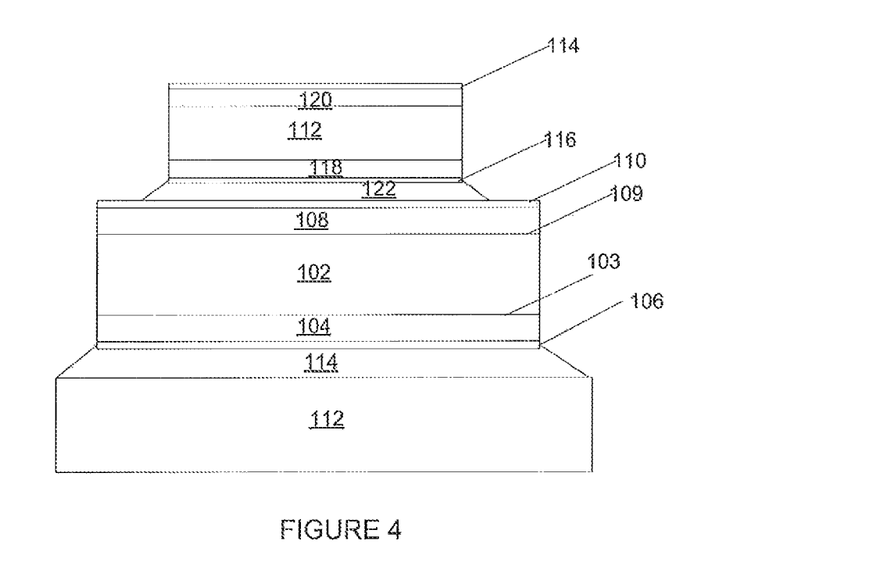
FIG. 4 is a diagram illustrating a semiconductor device with improved reliability in accordance with an alternative embodiment of the present disclosure.

Referring to FIG. 4, a diagram illustrating a semiconductor device with improved reliability is depicted in accordance with an alternative embodiment of the present disclosure. In this embodiment, a semiconductor chip 102 as illustrated in FIG. 3, having a front side 110 and a back side alloy layer 106 and disposed over a carrier 112, is provided. An additional semiconductor chip 112 is also provided and disposed over semiconductor chip 102.

In this embodiment, semiconductor chip 112 also comprises a front side 114 and a back side alloy layer 116 that are disposed over copper metallization layers 120 and 118 respectively. Semiconductor chip 112 is also attached to semiconductor chip 102 over a soldering material, such as tin-containing solder 122. Thus, a chip-on-chip configuration is provided. In one embodiment, the soldering material 122 is disposed over the alloy layer 110 of chip 102. Then, chip 112 is disposed over the soldering material 122 such that an interface is formed between the alloy layer 116 of chip 112 and the soldering material 122.

By providing an alloy layer, such as alloy layer 110, over the metallization layer, such as metallization layer 108, formation of intermetallic phases and voids between the copper metallization layer 108 and tin-containing solder joint 122 is reduced. Also, voids may be reduced at the interface between copper metallization layer 118 and soldering material 122 by providing alloy layer of Zinc 116. This results in improved reliability of the overall device.

Figure 5:
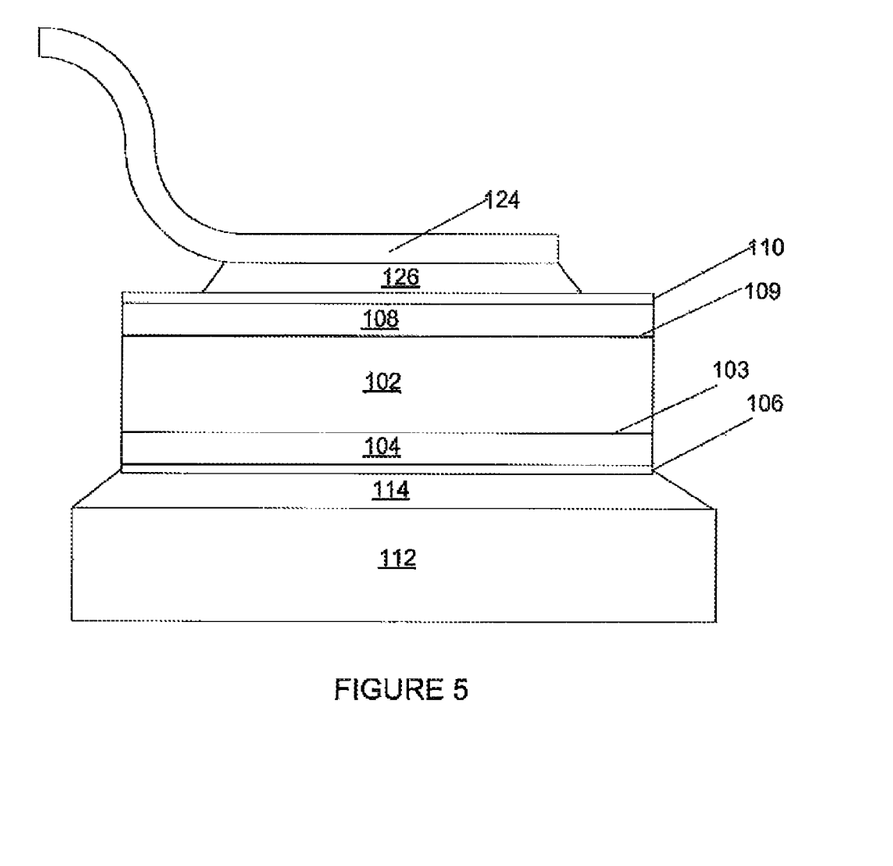
FIG. 5 is a diagram illustrating a semiconductor device with improved reliability in accordance with an alternative embodiment of the present disclosure.

Referring to FIG. 5, a diagram illustrating a semiconductor device with improved reliability is depicted in accordance with an alternative embodiment of the present disclosure. In this embodiment, a semiconductor chip 102 as illustrated in FIG. 3, having a front side 110 and a back side alloy layer 106 and disposed over a carrier 112, is provided. A clip 124 is attached to semiconductor chip 102 over a soldering material, such as tin-containing solder 126. The clip 124 provides external conductivity to semiconductor chip 102. Thus, a clip-on-chip configuration is provided. In one embodiment, the soldering material 126 is disposed over the alloy layer 110. Then, the clip 124 is attached to the soldering material 126.

By providing an alloy layer, such as alloy layer 110, over the metallization layer, such as metallization layer 108, formation of intermetallic phases and voids between the copper metallization layer 108 and tin-containing soldering material 126 attaching the clip 124 is reduced. Also, voids may be reduced at the interface between copper metallization layer 104 and soldering material 114 at the back surface 103 of the semiconductor chip 102 by providing alloy layer on Zinc 106. This results in improved reliability of the overall device.

Figure 6:
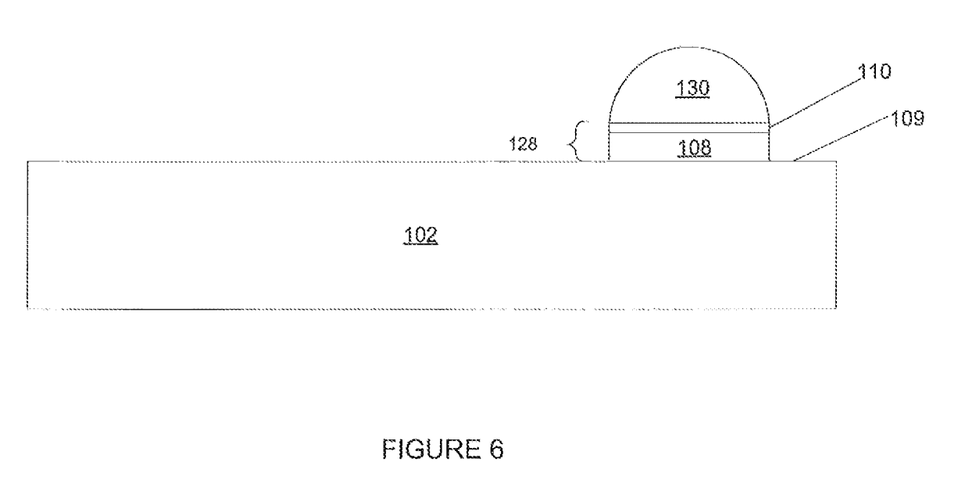
FIG. 6 is a diagram illustrating a semiconductor chip with improved reliability in accordance with yet another alternative embodiment of the present disclosure.

Referring to FIG. 6, a diagram illustrating a semiconductor chip with improved reliability is depicted in accordance with yet another alternative embodiment of the present disclosure. In this embodiment, a semiconductor chip 102 is provided. The semiconductor chip may be composed of silicon or other types of semiconductor materials. Semiconductor chip 102 comprises at least one contact element 128 that is disposed over the front surface 109 of the semiconductor chip 102.

Contact element 128 comprises a metallization layer so-called under bump metallization (UBM), such as copper metallization layer 108, and an alloy layer, such as alloy layer 110 disposed over the metallization layer 108. In one embodiment, the alloy layer 110 has a thickness from about 1 to 5 micrometers and has a alloy content of up to 20 percent Zn in weight. The alloy used may be zinc-copper alloy. The alloy layer 110 may be formed by galvanically depositing the alloy over the metallization layer 108.

At least one conductive element, such as solder ball 130, is disposed over the at least one contact element 128 to provide external conductivity to semiconductor chip 102. One example of solder ball 130 is a solder ball made of tin-containing solder material.

The alloy layer 110 reduces the formation of intermetallic phases and voids at the interface of copper metallization layer 108 and tin-containing solder ball 130 and thus increases the reliability of the semiconductor chip 102. In addition, the alloy layer 110 improves heat dissipation during attachment of semiconductor chip 102 to other external conductive elements.

Figure 7:
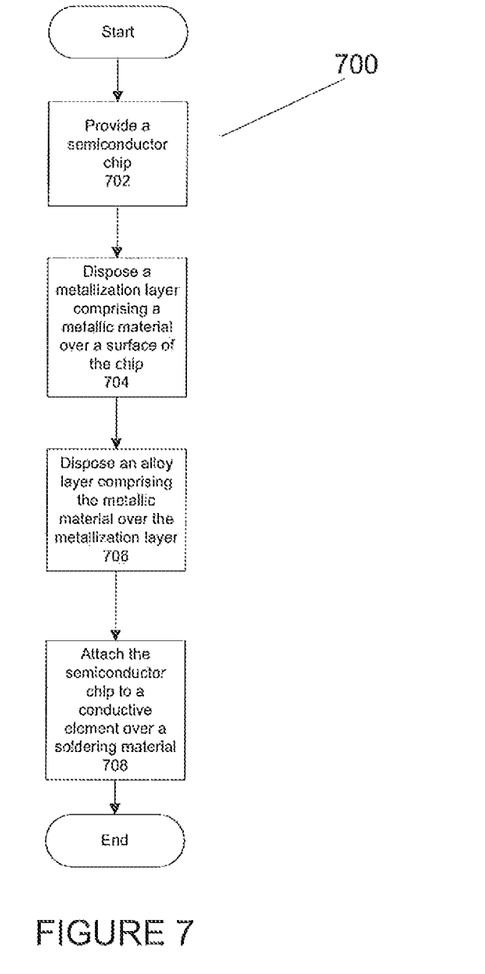
FIG. 7 is a flowchart of an exemplary process for improving reliability of a semiconductor device in accordance with one embodiment of the present disclosure.

Referring to FIG. 7, a flowchart of an exemplary process for an improving reliability of a semiconductor device is depicted in accordance with one embodiment of the present disclosure. Process 700 begins at step 702 to provide a semiconductor chip. For example, semiconductor chip 102 is provided. Next, process 700 continues to step 704 to dispose a metallization layer comprising a metallic material over a surface of the chip. For example, a metallization layer 104 comprising copper is disposed over a back surface 103 of the semiconductor chip 102. Alternatively, a metallization layer 108 comprising copper is disposed over a front surface 109 of the semiconductor chip 102.

Next, process 700 continues to step 706 to dispose an alloy layer comprising the metallic material over the metallization layer. For example, a zinc-copper alloy layer 106 may be galvanically deposited over the copper metallization layer 104 on the back surface 103 of the semiconductor chip 102. Alternatively, a zinc-copper alloy layer 110 may be galvanically deposited over the copper metallization layer 108 on the front surface 109 of the semiconductor chip 102.

Process 700 then completes at step 708 to attach the semiconductor chip to a conductive element over a soldering material. For example, semiconductor chip 102 is attached to a carrier or lead frame 112 over soldering material 114. The soldering material is a tin-containing soldering material. Alternatively, semiconductor chip 102 is attached to another semiconductor chip 112 over soldering material 122. In another embodiment, semiconductor chip 102 is attached to a clip 124 over soldering material 126. In yet another embodiment, semiconductor chip 102 is attached to a solder ball 130, which comprises the tin-containing soldering material itself.

In summary, the present disclosure provides a method and a system for improving reliability of a semiconductor device. A zinc copper alloy layer is galvanically deposited on a front or back surface of a semiconductor chip with a copper metallization layer. The alloy layer slows formation of intermetallic phase growth and reduces formation of voids at the interface of the copper metallization layer and a tin-containing soldering material. In addition, heat dissipation is improved during attachment of semiconductor chip. As a result, the reliability of the overall device is improved.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed:

1. A semiconductor device comprising:
a semiconductor chip;
a metallization layer comprising copper and disposed over a surface of the semiconductor chip;
an alloy layer comprising a zinc copper alloy and being a galvanic deposition over the metallization layer; and
an electrically conductive lead frame attached to the alloy layer via a soldering material over the at least one semiconductor chip providing an electrical connection between the lead frame and the semiconductor chip.

2. The semiconductor device of claim 1, wherein the metallization layer and alloy layer form an outermost metallization layer.

3. The semiconductor device of claim 1, wherein the metallization layer is disposed over at least a portion of the surface of the semiconductor chip.

4. The semiconductor device of claim 1, wherein the surface of the semiconductor chip is a front or a back surface of the semiconductor chip.

5. The semiconductor device of claim 1, wherein the metallization layer has a thickness of about 10 to about 15 micrometers.

6. The semiconductor device of claim 1, wherein the alloy layer comprises an alloy content of about 20 percent Zinc in weight.

7. The semiconductor device of claim 1, wherein the alloy layer has a thickness of about 1 to about 5 micrometers.

8. The semiconductor device of claim 1, wherein the soldering material is a tin-containing soldering material.

9. The semiconductor device of claim 1, wherein an interface is formed between the soldering material and the metallization layer.

10. The semiconductor device of claim 9, wherein the interface is free from a void.

11. A semiconductor device comprising:
at least one semiconductor chip;
a metallization layer comprising copper disposed over at least one surface of the at least one semiconductor chip;
an alloy layer comprising a zinc copper alloy and being a galvanic deposition over the metallization layer; and
an electrically conductive lead frame attached to the alloy layer via a soldering material disposed over the at least one semiconductor chip,
wherein an interface between the soldering material and the alloy layer is substantially free of voids.

12. The semiconductor device of claim 11, wherein the at least one surface is at least one of a front or a back surface.

13. The semiconductor device of claim 11, wherein the metallization layer and alloy layer form an outermost metallization layer.

14. A method for improving reliability of a semiconductor device comprising:
providing a semiconductor chip;
disposing a metallization layer comprising a copper over at least a portion of a surface of the semiconductor chip;
galvanically depositing an alloy layer comprising a zinc copper alloy over the metallization layer;
attaching an electrically conductive lead frame to the alloy layer via a soldering material to provide an electrical connection between the lead frame and the semiconductor chip,
wherein an interface between the soldering, material and the alloy layer is substantially free of a voids.

15. The method of claim 14, wherein attaching the electrically conductive lead frame to the alloy layer comprises:
 disposing a tin-containing soldering material over the alloy layer; and
 attaching the electrically conductive lead frame to the tin-containing soldering material.

\* \* \* \* \*

UNITED STATES PATENT AND TRADEMARK OFFICE
CERTIFICATE OF CORRECTION

PATENT NO.         : 8,884,434 B2                                              Page 1 of 1
APPLICATION NO.    : 12/890721
DATED              : November 11, 2014
INVENTOR(S)        : Manfred Mengel, Joachim Mahler and Khalil Hosseini It is certified that error appears in the above-identified patent and that said Letters Patent is hereby corrected as shown below:

In the Claims

Col. 8, ln. 66, claim 14, delete "the soldering, material" and insert --the soldering material-- therefor.

Signed and Sealed this
Twenty-first Day of April, 2015

Michelle K. Lee
*Director of the United States Patent and Trademark Office*